(12) United States Patent
Dai et al.

(10) Patent No.: US 9,344,658 B2
(45) Date of Patent: May 17, 2016

(54) NEGATIVE BIASED SUBSTRATE FOR PIXELS IN STACKED IMAGE SENSORS

(71) Applicant: OMNIVISION TECHNOLOGIES, INC., Santa Clara, CA (US)

(72) Inventors: Tiejun Dai, Santa Clara, CA (US); Rui Wang, San Jose, CA (US); Dyson H. Tai, San Jose, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 99 days.

(21) Appl. No.: 14/448,154

(22) Filed: Jul. 31, 2014

(65) Prior Publication Data

US 2016/0037111 A1    Feb. 4, 2016

(51) Int. Cl.
*H01L 27/00*    (2006.01)
*H04N 5/378*    (2011.01)
*H04N 5/376*    (2011.01)
*H01L 27/146*    (2006.01)

(52) U.S. Cl.
CPC .......... *H04N 5/378* (2013.01); *H01L 27/14612* (2013.01); *H01L 27/14634* (2013.01); *H01L 27/14636* (2013.01); *H04N 5/376* (2013.01)

(58) Field of Classification Search
CPC .................... H01L 27/14634; H01L 27/14638

USPC ...................................................... 250/208.1
See application file for complete search history.

(56) References Cited

U.S. PATENT DOCUMENTS

| 6,853,044 B1 * | 2/2005 | Chung | .............. H01L 27/14601 257/290 |
| 2015/0123173 A1 * | 5/2015 | He | .................... H01L 27/14634 257/231 |

* cited by examiner

*Primary Examiner* — Thanh Luu
(74) *Attorney, Agent, or Firm* — Blakely Sokoloff Taylor & Zafman LLP

(57) ABSTRACT

A pixel cell includes a photodiode disposed within a first semiconductor chip for accumulating an image charge in response to light incident upon the photodiode. A transfer transistor is disposed within the first semiconductor chip and coupled to the photodiode to transfer the image charge from the photodiode. A bias voltage generation circuit disposed within a second semiconductor chip for generating a bias voltage. The bias voltage generation circuit is coupled to the first semiconductor chip to bias the photodiode with the bias voltage. The bias voltage is negative with respect to a ground voltage of the second semiconductor chip. A floating diffusion is disposed within the second semiconductor chip. The transfer transistor is coupled to transfer the image charge from the photodiode on the first semiconductor chip to the floating diffusion on the second semiconductor chip.

24 Claims, 4 Drawing Sheets

NEGATIVE BIASED SUBSTRATE FOR PIXELS IN STACKED IMAGE SENSORS

BACKGROUND INFORMATION

1. Field of the Disclosure

This invention is related to image sensors. In particular, embodiments of the present invention are related to stacked image sensors.

2. Background

An image capture device includes an image sensor and an imaging lens. The imaging lens focuses light onto the image sensor to form an image, and the image sensor converts the light into electric signals. The electric signals are output from the image capture device to other components of a host electronic system. The electronic system may be, for example a mobile device, a computer, a digital camera, a medical device, etc.

There is a continuing demand to decrease the size and improve the performance of image sensors. Factors that affect performance in an image sensor pixel cell include image charge transfer efficiency, image lag, and readout pixel noise. Known methods to reduce image lag include boosting the floating diffusion voltage. However, one tradeoff in boosting the floating diffusion voltage is that an additional boost line to the pixel cell may be required, which consequently requires an extra metal line for the pixel cell and therefore increases the size of the pixel cell. Another known method to reduce image lag is to increase the voltage swing of the transfer transistor of the pixel cell so that the floating diffusion voltage is boosted. However, a tradeoff with this method is that the increase of the voltage swing of the transfer transistor requires additional circuitry for the pixel cell, which increases pixel size, cost and complexity.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
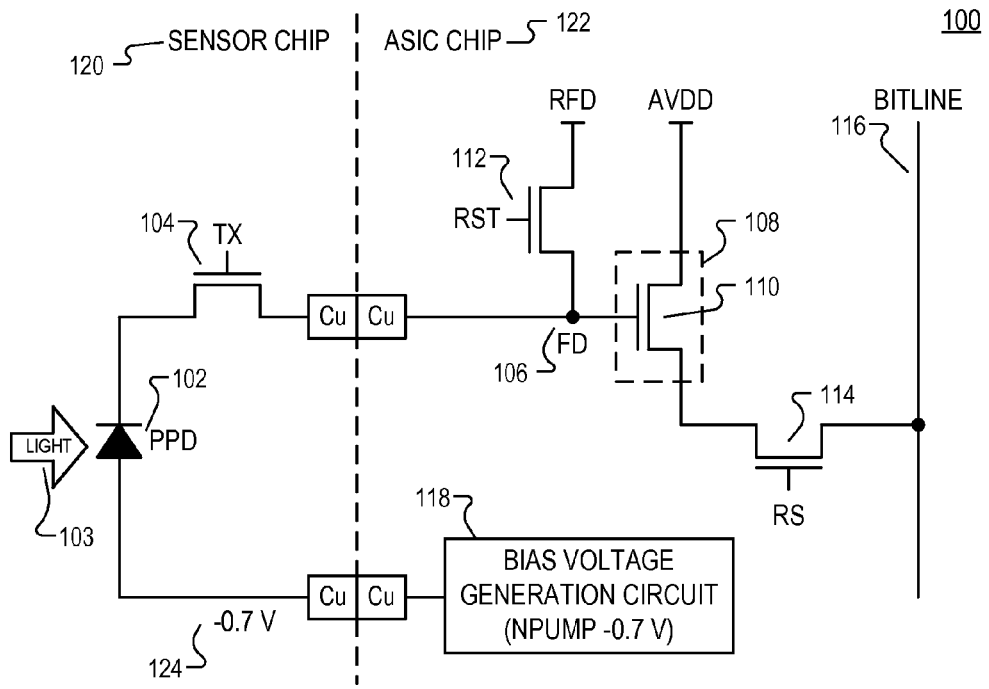
FIG. 1A shows one example schematic of a pixel cell in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses for implementing an example pixel cell in a stacked image sensor with separately biased chips are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be shown, examples of a pixel cell in an image sensor with separately biased chips in a stacked chip scheme are disclosed. In various examples, the substrate of a pinned photodiode of a pixel cell is biased at a negative voltage compared the ground voltage of a separate substrate that includes the floating diffusion of the pixel cell. For instance, in one example, the pinned photodiode is biased at −0.7 volts, while the ground voltage of the separate substrate including the floating diffusion is biased at zero volts. With the negative bias voltage of the photodiode compared with the zero volt bias of the separate substrate that includes the floating diffusion, the image charge transfer efficiency from the photodiode through the transfer transistor to the floating diffusion is improved in accordance with the teachings of the present invention. In one example, the negative biased photodiode may be amplified with an amplifier circuit having a common source coupled transistor, which reduces readout noise of image data from the pixel cell in accordance with the teachings of the present invention.

To illustrate, FIG. 1A shows one example schematic of a pixel cell 100 in accordance with the teachings of the present invention. As shown in the depicted example, pixel cell 100 is implemented in a stacked chip scheme that includes a first semiconductor chip 120 and a second semiconductor chip 122, which are stacked and coupled together. In one example, first semiconductor chip 120 is a sensor chip and second semiconductor chip 122 is an application specific integrated circuit (ASIC) chip.

In the illustrated example, pixel cell 100 includes a photodiode 102 disposed in first semiconductor chip 120. In one example, photodiode 102 is a pinned photodiode (PPD) that accumulates image charge in response to light 103 that is incident upon photodiode 102. A transfer transistor 104 is disposed within the first semiconductor chip 120 and is coupled to the photodiode 102 to transfer the accumulated image charge from the photodiode 102.

The example in FIG. 1A shows that a bias voltage generation circuit 118 is disposed within second semiconductor chip 122 for generating a bias voltage 124. In one example, bias voltage generation circuit 118 includes a negative charge pump circuit to generate a negative bias voltage 124, such as for example −0.7 volts, which is coupled to the first semiconductor chip 120 through contacts to bias the photodiode 102 with the bias voltage 124 in accordance with the teachings of the present invention. In one example the contacts coupling together first semiconductor chip 120 and second semiconductor chip 122 are made of a conductive material, such as for example copper, and are labeled "Cu" in FIG. 1A. As will be discussed in further detail below, the second semiconductor chip 122 in one example is separately biased with a ground voltage of zero volts. In the depicted example, a floating diffusion (FD) 106 is disposed within the second semiconductor chip 122. The transfer transistor 104 is coupled to transfer the image charge accumulated in photodiode 102 from the photodiode 102 on the first semiconductor chip 120 to the floating diffusion 106 on the second semiconductor chip 122 through contacts in response to a transfer signal TX in accordance with the teachings of the present invention.

Pixel cell 100 also includes a reset transistor 112 that is disposed within the second semiconductor chip 122 and is coupled to the floating diffusion 106 to reset the floating diffusion node to a reset voltage RFD in response to a reset signal RST. As shown in the depicted example, an amplifier circuit 108, which has an input terminal that is coupled to the floating diffusion 106, is coupled to generate amplified image data at an output terminal of the amplifier circuit in response to the image charge that is transferred through the transfer transistor 104 to the floating diffusion 106.

In the example depicted in FIG. 1A, the amplifier circuit 108 includes a source follower coupled transistor 110 having a gate terminal coupled to the input terminal of the amplifier circuit 108 and to floating diffusion 106, and a source terminal coupled to the output terminal of the amplifier circuit 108. In the illustrated example, the drain terminal of the source follower coupled transistor 110 is coupled to an AVDD voltage. A row select transistor 114 is disposed within the second semiconductor chip 122 and is coupled to the output terminal of the amplifier circuit 108. The row select transistor 114 is coupled to output amplified image data from the amplifier circuit 108 to a bitline 116 that is coupled to the row select transistor 114.

Figure 1B:
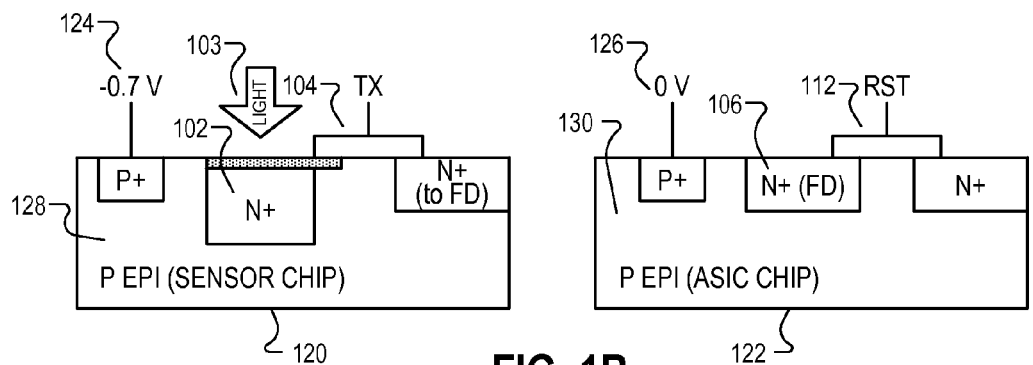
FIG. 1B shows cross-section illustrations of portions of example first and second semiconductor chips utilized in a pixel cell in accordance with the teachings of the present invention.

FIG. 1B shows cross-section illustrations of portions of example first semiconductor chip 120 and second semiconductor chip 122 that are utilized in a pixel cell in accordance with the teachings of the present invention. It is appreciated that first semiconductor chip 120 and second semiconductor chip 122 are cross-section examples of first semiconductor chip 120 and second semiconductor chip 122 discussed in FIG. 1A, and it should be appreciated that similarly named and numbered elements referenced below are coupled and function as described above.

As shown in the example of FIG. 1B, first semiconductor chip 120 includes a semiconductor substrate 128, which in one example includes p doped epitaxial semiconductor material such as for example silicon. In the illustrated example, the semiconductor substrate 128 of first semiconductor chip 120 is biased at −0.7 volts with bias voltage 124 through a highly doped P+ region as shown. As shown in the example, second semiconductor chip 122 includes a semiconductor substrate 130, which in one example includes p doped epitaxial semiconductor material such as for example silicon. In the illustrated example, the semiconductor substrate 130 of second semiconductor chip 122 is separate from semiconductor substrate 128, and is separately biased at a ground voltage of zero volts 126 through a highly doped P+ region as shown.

In operation, image charge is accumulated in photodiode 102 in response to light 103 that is incident upon the photodiode 102 on first semiconductor chip 120. The transfer transistor 104 is coupled to transfer the image charge that is accumulated in photodiode 102 to the floating diffusion 106, which is disposed in the semiconductor substrate 130 of second semiconductor chip 122 in response to transfer signal TX. The reset transistor is coupled to the floating diffusion 106 in the second semiconductor chip 122 to reset the floating diffusion in response to the reset signal RST.

It is appreciated that with the semiconductor substrate 128 being separately biased at −0.7 volts compared to the semiconductor substrate 130 being biased at zero volts, the pinned voltage of photodiode 102 has a lower pinned voltage, which is the voltage when the N+ region of photodiode 102 is fully depleted. A lower pinned voltage has a better image charge transfer efficiency and less image lag in accordance with the teachings of the present invention compared to a photodiode that is pinned at zero volts.

Figure 1C:
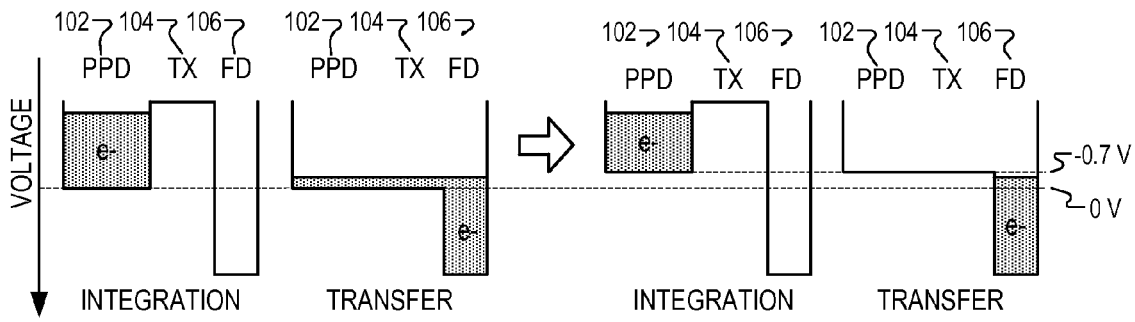
FIG. 1C shows a diagram illustrating integration and the subsequent transfer of image charge in a pixel cell in accordance with the teachings of the present invention.

To illustrate, FIG. 1C shows a diagram illustrating integration and the subsequent transfer of image charge in a pixel cell in accordance with the teachings of the present invention. It is noted that the voltage on the y-axis in FIG. 1C increases from the up to down direction. For the sake of comparison, the example diagram on the left hand side of the diagram of FIG. 1C shows image charge that is accumulated during integration for a pinned photodiode 102 that is pinned at zero volts, which is the same zero volt bias voltage applied to the substrate of the floating diffusion 106. Continuing with the example, when the transfer transistor 104 is switched on to transfer the image charge (e−) to the floating diffusion 106, the transfer efficiency of the image charge (e−) from the photodiode 102 to the floating diffusion 106 is poor as shown, which also has the consequence of increased image lag.

However, the example diagram on the right hand side of the diagram of FIG. 1C shows image charge (e−) that is accumulated during integration in a pinned photodiode 102 that is disposed in a substrate that is biased at −0.7 volts, which therefore pins the photodiode 102 at −0.7 volts, which is less than the zero volt bias voltage applied to the substrate of the floating diffusion 106, as shown and described above in FIGS. 1A-1B. As shown in FIG. 1C, when the transfer transistor 104 is switched on to transfer the accumulated image charge (e−) to the floating diffusion 106, the transfer efficiency of the image charge from the photodiode 102 to the floating diffusion 106 is improved, which therefore results in reduced image lag in accordance with the teachings of the present invention.

In another example, it is appreciated that the negative bias voltage 124 may have values other than −0.7 volts to improve image charge transfer efficiency in accordance with the teachings of the present invention, as long as the drop in the floating diffusion 106 voltage is less than the voltage drop in the semiconductor substrate 128 of the photodiode 102 in accordance with the teachings of the present invention.

It is therefore appreciated that the improved image charge transfer efficiency realized with a photodiode that is pinned at a negative voltage with respect to the floating diffusion in accordance with the teachings of the present invention is realized without having to boost the floating diffusion voltage, or provide a high voltage swing on the transfer gate transistor to boost the floating gate voltage. As such, an additional high voltage supply HVDD to switch the transfer transistor is not needed, which results in an overall cost savings for the pixel cell since an extra high voltage charge pump and external capacitor are not needed in accordance with the teachings of the present invention.

Figure 2:
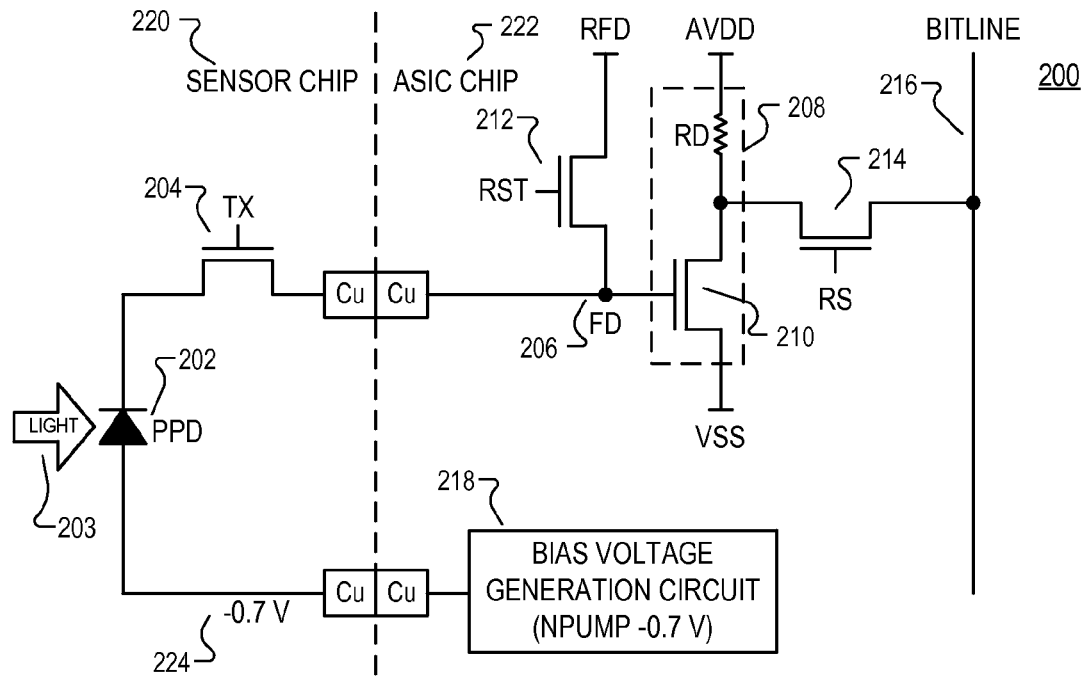
FIG. 2 shows another example schematic of a pixel cell in accordance with the teachings of the present invention.

FIG. 2 shows another example schematic of a pixel cell 200 in accordance with the teachings of the present invention. It is appreciated that pixel cell 200 of FIG. 2 shares many similarities with pixel cell 100 of FIG. 1A, and that similarly named and numbered elements referenced above are therefore coupled and function similar to as described below.

One difference between pixel 200 of FIG. 2 and pixel cell 100 of FIG. 1A is that the amplifier circuit 208 of FIG. 2 includes a common source coupled transistor 210 as shown, which has a gate terminal coupled to the input terminal of the amplifier circuit 208, and a drain terminal coupled to the output terminal of the amplifier circuit 208 and to AVDD through resistor RDD as shown in accordance with the teachings of the present invention. It is appreciated that with a negatively biased semiconductor substrate for photodetector 202 combined with common source coupled transistor 210 included in amplifier circuit 208 as shown, the conversion gain is boosted for the amplified image data with reduced readout noise in accordance with the teachings of the present invention.

Figure 3:
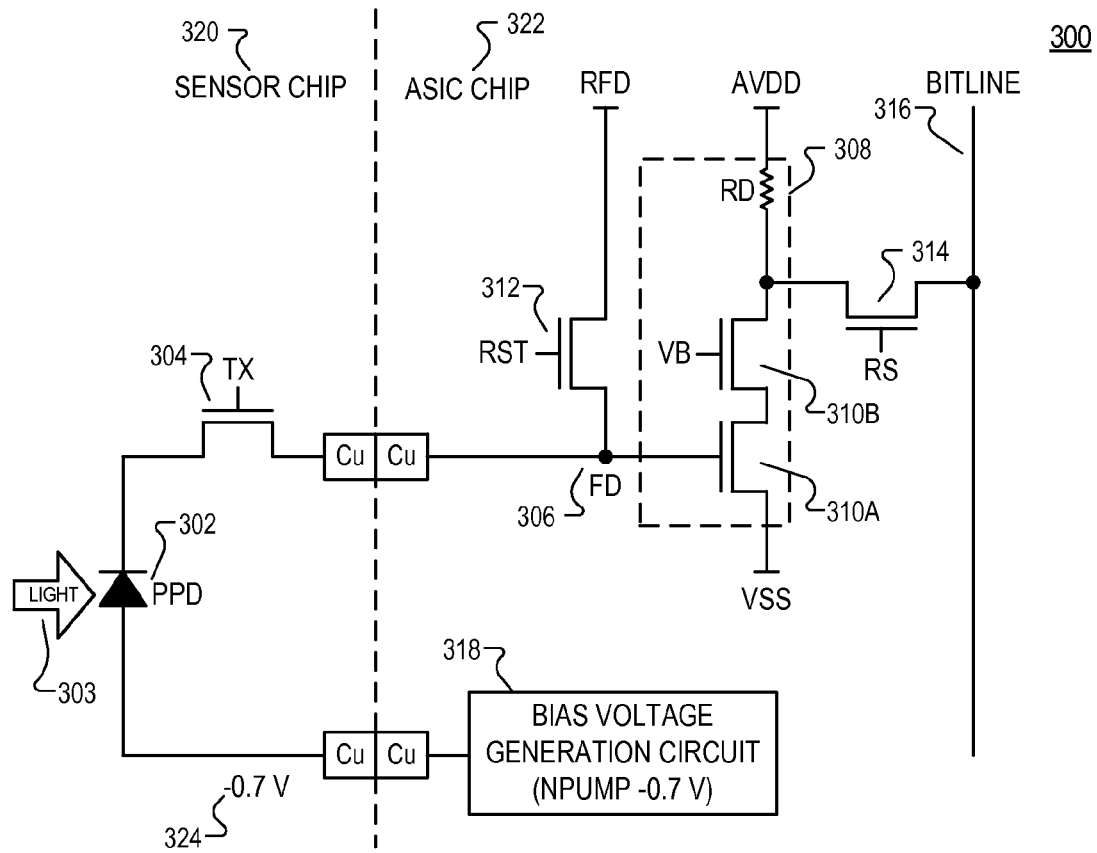
FIG. 3 shows yet another example schematic of a pixel cell in accordance with the teachings of the present invention.

FIG. 3 shows yet another example schematic of a pixel cell 300 in accordance with the teachings of the present invention. It is appreciated that pixel cell 300 of FIG. 3 shares many similarities with pixel cell 100 of FIG. 1A and pixel cell 200 of FIG. 2, and that similarly named and numbered elements referenced above are therefore coupled and function similar to as described below.

One difference between pixel 300 of FIG. 3 and pixel cell 100 of FIG. 1A and pixel cell 200 of FIG. 2 is that the amplifier circuit 308 of FIG. 3 is a cascode coupled amplifier circuit 308, which includes a first cascode coupled transistor 310A coupled to a second cascode coupled transistor 310B as shown. As such, the gate terminal of the first cascode coupled transistor 310A is coupled to the input terminal of the amplifier circuit 308, and a drain terminal of the second cascode coupled transistor 310B is coupled to the output terminal of the amplifier circuit 308 and AVDD through resistor RD as shown. In the example, the drain terminal of the first cascode coupled transistor 310A is coupled to the source terminal of the second cascode coupled transistor 310B and the gate terminal is coupled to a bias voltage VB as shown. It is appreciated that with a negatively biased semiconductor substrate for photodetector 302 combined with a cascode coupled amplifier circuit 308 as shown, the photo-response non uniformity (PRNU) of a pixel array including a plurality of pixel cells 300 is largely improved in accordance with the teachings of the present invention. Furthermore, it is appreciated that with a stacked chip scheme for the semiconductor chips utilized to realize pixel cell 300, sufficient semiconductor real estate is available in second semiconductor chip 222 to provide the first and second cascode coupled transistors 310A and 310B of amplifier circuit 308 in accordance with the teachings of the present invention.

Figure 4:
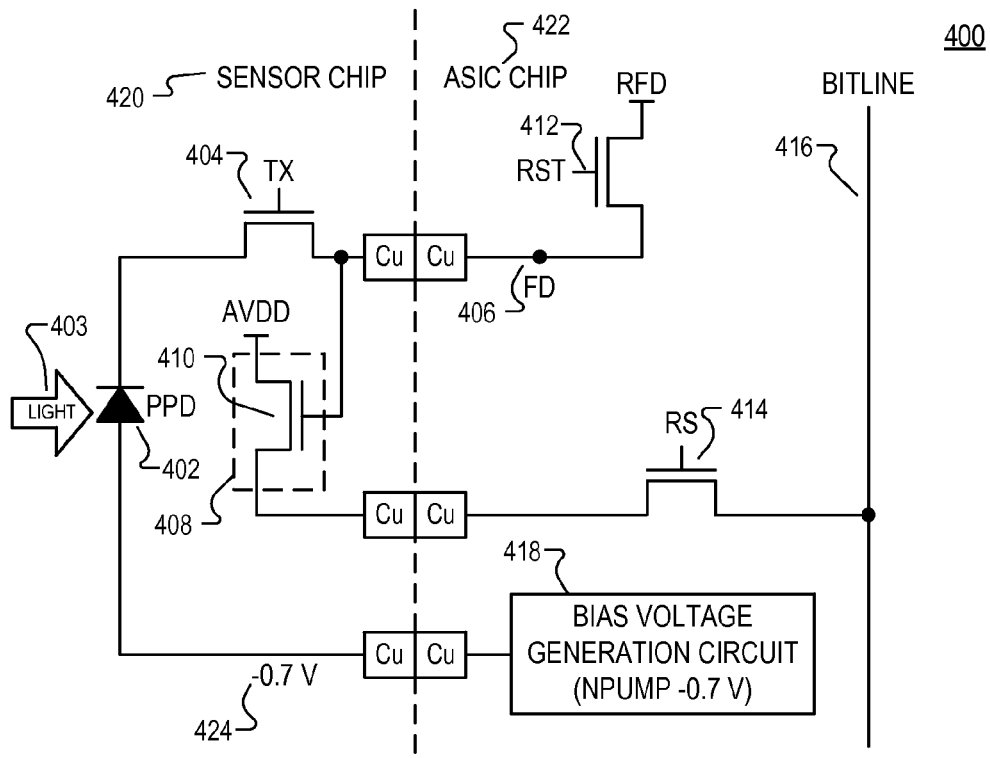
FIG. 4 shows still another example schematic of a pixel cell in accordance with the teachings of the present invention.

FIG. 4 shows still another example schematic of a pixel cell 400 in accordance with the teachings of the present invention. It is appreciated that pixel cell 400 of FIG. 4 shares many similarities with pixel cell 100 of FIG. 1A, and that similarly named and numbered elements referenced above are therefore coupled and function similar to as described below.

One difference between pixel 400 of FIG. 4 and pixel cell 100 of FIG. 1A, is that the amplifier circuit 408, and corresponding source follower coupled transistor 410, is included in the first semiconductor chip 420 of FIG. 4 as shown. As such, the input terminal of amplifier circuit 408 is coupled to the floating diffusion 406 through coupled contacts between first semiconductor chip 420 and second semiconductor chip 422 as shown. In addition, the output terminal of amplifier circuit is coupled to the row select transistor 414 through contacts coupled between first semiconductor chip 420 and second semiconductor chip 422 as shown.

In one example, it is appreciated that pixel cell 400 may be included in an example of a pixel array implemented with array-level pixel stacking. In the example, the first semiconductor chip 420 (i.e., the sensor chip including a pixel array having a plurality of pixel cells 400) is biased at a negative voltage (e.g., −0.7 volts) as discussed above. In this example, the source follower coupled transistor 410 of amplifier circuit 408 is on the same semiconductor substrate as the photodiode 402 and transfer transistor 404. It is noted that one difference from a pixel-level stacking example is that the body effect causes a higher threshold voltage for the source follower transistor 410 being disposed in the same semiconductor substrate as the photodiode 402.

Figure 5:
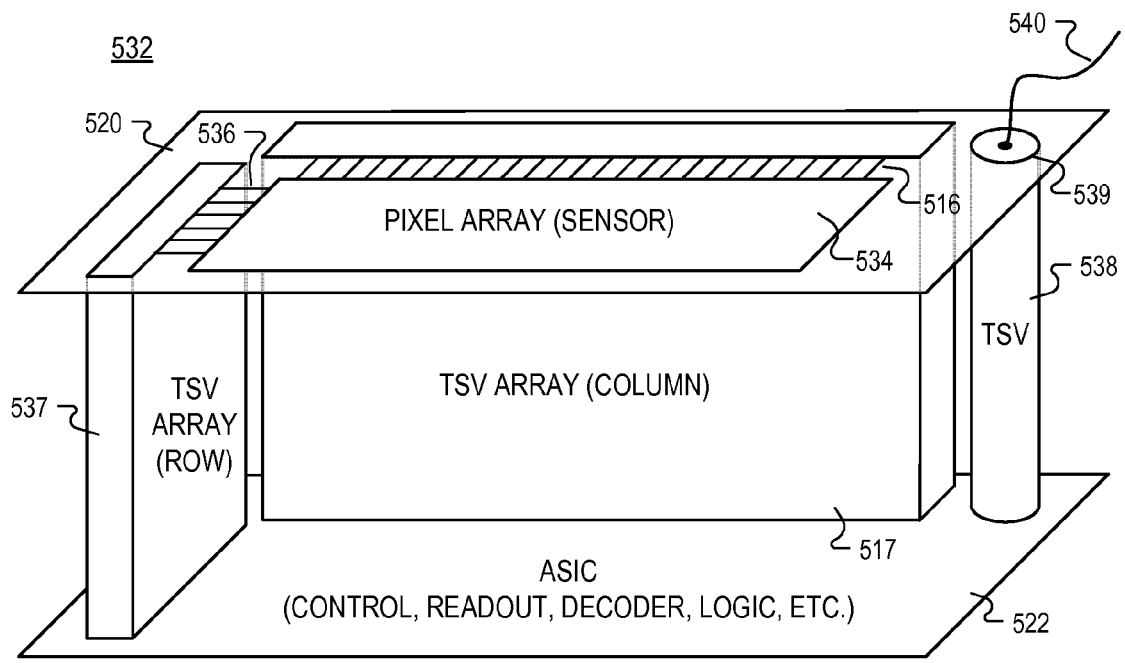
FIG. 5 shows stacked first and second semiconductor chips of an imaging system including an array pixel cells in accordance with the teachings of the present invention.

FIG. 5 shows an example of first and second semiconductor chips of an imaging system 532 in a stacked chip scheme with array-level stacking in accordance with the teachings of the present invention. As shown in the depicted example, imaging system 532 includes a first semiconductor chip 520 and a second semiconductor chip 522, which are stacked and coupled together through connections including for example through silicon via (TSV) 538. In various examples, external connections may be made to imaging system 532 through bonding pads and bonding wires, such as for example bonding pad 539 and bonding wire 540 as shown.

In one example, first semiconductor chip 520 is a sensor chip and includes a pixel array 534, which includes a plurality of pixel cells. It is appreciated that the pixel cells included in pixel array 534 may be examples of pixel cells 100 of FIG. 1A, pixel cells 200 of FIG. 2, pixel cells 300 of FIG. 3, or pixel cells 400 of FIG. 4, and it should be appreciated that similarly named and numbered elements referenced above are coupled and function as described below.

In one example, second semiconductor chip 522 is an ASIC chip and includes circuitry, such as for example control circuitry, decoder circuitry, readout circuitry, functional logic including digital circuitry such as an image signal processor (ISP), reference circuitry, input/output circuitry, and the like, to control pixel array 534 and process image data that is readout from pixel array 534 in accordance with the teachings of the present invention. For instance, in one example, row decoder circuitry that is included in the control circuitry on second semiconductor chip 522 is coupled to generate row select signals, shutter signals, or other pixel control signals that may be coupled to rows of pixels in pixel array 534 through TSV array 537 and control lines 536 that are coupled to pixel array 534 as shown. In the example, readout circuitry included on second semiconductor chip 522 is coupled to read out the image data generated from pixel array 534 through column bitlines 516 and TSV array 517 as shown.

Figure 6:
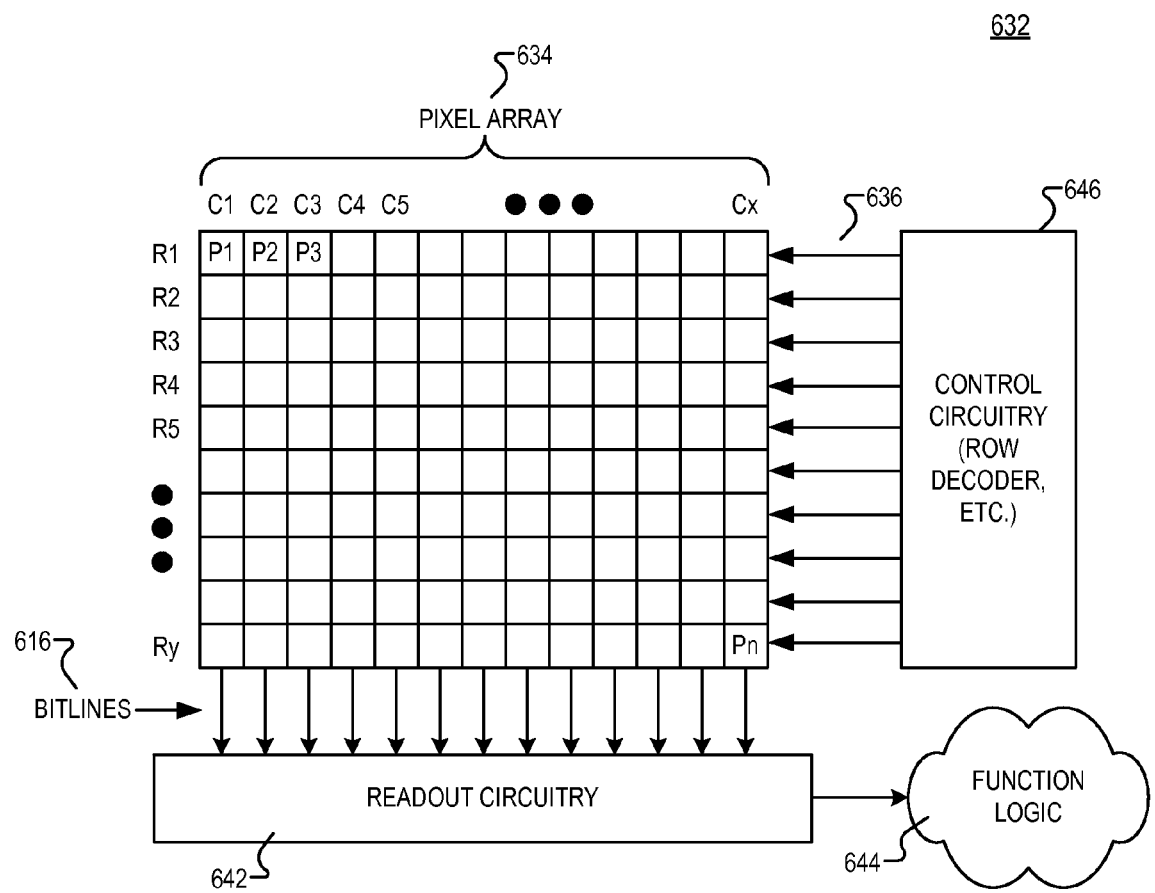
FIG. 6 is a block diagram illustrating an imaging system including an array of pixel cells in accordance with the teachings of the present invention.

FIG. 6 is a block diagram illustrating a portion of an imaging system 632 including an array of pixel cells with corresponding readout circuitry, control circuitry and function logic in accordance with the teachings of the present invention. As shown in the depicted example, the imaging system 632 includes a pixel array 634, readout circuitry 642, function logic 644, and control circuitry 646 in accordance with the teachings of the present invention.

As shown in the example illustrated in FIG. 6, pixel array 634 is a two dimensional (2D) array of pixel cells (e.g., pixel cells P1, P2, Pn). In one example, each of the pixel cells P1, P2, . . . P3, Pn may be examples of pixel cells 100 of FIG. 1A, pixel cells 200 of FIG. 2, pixel cells 300 of FIG. 3, or pixel cells 400 of FIG. 4, and it should be appreciated that similarly named and numbered elements referenced above are coupled and function as described below. As illustrated, each pixel cell is arranged into a row (e.g., rows R1 to Ry) and a column (e.g., column C1 to Cx) to acquire image data for an image of a person, place, object, etc., which can then be used to render a 2D image of the person, place, object, etc., in accordance with the teachings of the present invention.

In one example, after each pixel cell P1, P2, P3, . . . Pn has accumulated its image charge, the image data generated in response to the image charge is read out by readout circuitry 642 through bitlines 616 and then transferred to function logic 644. In various examples, readout circuitry 642 may include amplification circuitry, analog-to-digital (ADC) conversion circuitry, or otherwise. Function logic 644 may include digital circuitry and may simply store the image data or even manipulate the image data with image signal processing techniques to apply post image effects (e.g., crop, rotate, remove red eye, adjust brightness, adjust contrast, or otherwise). In one example, readout circuitry 642 may read out a row of image data at a time along bitlines 616 (illustrated) or may read out the image data using a variety of other techniques (not illustrated), such as for example a serial read out or a full parallel read out of all pixels simultaneously.

In one example, control circuitry 646 is coupled to pixel array 634 to control operational characteristics of pixel array 634. In one example, control circuitry 646 is coupled to generate a global shutter signal for controlling image acquisition for each pixel cell through control lines 636. In the example, the global shutter signal simultaneously enables all pixel cells P1, P2, P3, . . . Pn within pixel array 634 to simultaneously enable all of the pixel cells in pixel array 634 to simultaneously transfer the image charge from each respective photodiode during a single acquisition window.

In one example, it is noted that imaging system 632 illustrated in FIG. 6 may be implemented in a stacked chip scheme as discussed in the examples above. For instance, in one example, pixel array 634 may be included in a sensor chip, while readout circuitry 642, function logic 644, and control circuitry 646, as illustrated in FIG. 6, may be included in a separate ASIC chip in accordance with the teachings of the present invention. In the example, the sensor chip and ASIC chip are stacked and coupled together during fabrication to implement imaging system 632 in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A pixel cell, comprising:
a photodiode disposed within a first substrate of a first semiconductor chip for accumulating an image charge in response to light incident upon the photodiode;
a transfer transistor disposed within the first substrate of the first semiconductor chip and coupled to the photodiode to transfer the image charge from the photodiode;
a bias voltage generation circuit disposed within a second semiconductor chip for generating a bias voltage, wherein the bias voltage generation circuit is coupled to the first substrate of the first semiconductor chip to bias the photodiode with the bias voltage, wherein the bias voltage is a negative voltage with respect to a ground voltage of a second substrate of the second semiconductor chip; and
a floating diffusion disposed within the second substrate of the second semiconductor chip such that the first substrate in which the photodiode is disposed is biased at the negative voltage with respect to the ground voltage of the second substrate in which the floating diffusion is disposed, wherein the transfer transistor is coupled to transfer the image charge from the photodiode on the first semiconductor chip to the floating diffusion on the second semiconductor chip.

2. The pixel cell of claim 1 further comprising a reset transistor disposed within the second substrate of the second semiconductor chip and coupled to the floating diffusion to reset the floating diffusion to a reset voltage.

3. The pixel cell of claim 1 further comprising an amplifier circuit having an input terminal coupled to the floating diffusion to generate amplified image data at an output terminal of the amplifier circuit in response to the image charge transferred through the transfer transistor to the floating diffusion.

4. The pixel cell of claim 3 further comprising a row select transistor disposed within the second substrate of the second semiconductor chip and coupled to the output terminal of the amplifier circuit to output the amplified image data from the amplifier circuit to a bitline coupled to the row select transistor.

5. The pixel cell of claim 3 wherein the amplifier circuit comprises a source follower coupled transistor having a gate terminal coupled to the input terminal of the amplifier circuit, and a source terminal coupled to the output terminal of the amplifier circuit.

6. The pixel cell of claim 3 wherein the amplifier circuit comprises a common source coupled transistor having a gate terminal coupled to the input terminal of the amplifier circuit, and a drain terminal coupled to the output terminal of the amplifier circuit.

7. The pixel cell of claim 3 wherein the amplifier circuit comprises a cascode amplifier circuit comprising first and second cascode coupled transistors, wherein a gate terminal of the first cascode coupled transistor is coupled to the input terminal of the amplifier circuit, and a drain terminal of the second cascode coupled transistor is coupled to the output terminal of the amplifier circuit.

8. The pixel cell of claim 3 wherein the amplifier circuit is disposed within the second substrate of the second semiconductor chip.

9. The pixel cell of claim 3 wherein the amplifier circuit is disposed within the first substrate of the first semiconductor chip.

10. The pixel cell of claim 1 wherein the bias voltage generation circuit comprises a negative charge pump circuit coupled to generate the bias voltage.

11. The pixel cell of claim 1 wherein the first semiconductor chip and the second semiconductor chip are stacked and coupled together.

12. An imaging system, comprising:
a pixel array including a plurality of pixel cells, wherein each one of the pixel cells includes:
a photodiode disposed within a first substrate of a first semiconductor chip for accumulating an image charge in response to light incident upon the photodiode;
a transfer transistor disposed within the first substrate of the first semiconductor chip and coupled to the photodiode to transfer the image charge from the photodiode;
a bias voltage generation circuit disposed within a second semiconductor chip for generating a bias voltage, wherein the bias voltage generation circuit is coupled to the first substrate of the first semiconductor chip to bias the photodiode with the bias voltage, wherein the bias voltage is a negative voltage with respect to a ground voltage of a second substrate of the second semiconductor chip; and
a floating diffusion disposed within the second substrate of the second semiconductor chip such that the first substrate in which the photodiode is disposed is biased at the negative voltage with respect to the ground voltage of the second substrate in which the floating diffusion is disposed, wherein the transfer transistor is coupled to transfer the image charge from the photodiode on the first semiconductor chip to the floating diffusion on the second semiconductor chip;
control circuitry coupled to the pixel array to control operation of the pixel array; and
readout circuitry coupled to the pixel array to read out amplified image data from the plurality of pixels.

13. The imaging system of claim 12 further comprising function logic coupled to the readout circuitry to store the amplified image data read out from the pixel array.

14. The imaging system of claim 12 further comprising a reset transistor disposed within the second substrate of the second semiconductor chip and coupled to the floating diffusion to reset the floating diffusion to a reset voltage.

15. The imaging system of claim 12 further comprising an amplifier circuit having an input terminal coupled to the floating diffusion to generate amplified image data at an output terminal of the amplifier circuit in response to the image charge transferred through the transfer transistor to the floating diffusion.

16. The imaging system of claim 15 further comprising a row select transistor disposed within the second substrate of the second semiconductor chip and coupled to the output terminal of the amplifier circuit to output the amplified image data from the amplifier circuit to a bitline coupled to the row select transistor.

17. The imaging system of claim 15 wherein the amplifier circuit comprises a source follower coupled transistor having a gate terminal coupled to the input terminal of the amplifier circuit, and a source terminal coupled to the output terminal of the amplifier circuit.

18. The imaging system of claim 15 wherein the amplifier circuit comprises a common source coupled transistor having a gate terminal coupled to the input terminal of the amplifier circuit, and a drain terminal coupled to the output terminal of the amplifier circuit.

19. The imaging system of claim 15 wherein the amplifier circuit comprises a cascode amplifier circuit comprising first and second cascode coupled transistors, wherein a gate terminal of the first cascode coupled transistor is coupled to the input terminal of the amplifier circuit, and a drain terminal of the second cascode coupled transistor is coupled to the output terminal of the amplifier circuit.

20. The imaging system of claim 15 wherein the amplifier circuit is disposed within the second substrate of the second semiconductor chip.

21. The imaging system of claim 15 wherein the amplifier circuit is disposed within the first substrate of the first semiconductor chip.

22. The imaging system of claim 12 wherein the bias voltage generation circuit comprises a negative charge pump circuit coupled to generate the bias voltage.

23. The imaging system of claim 12 wherein the first semiconductor chip and the second semiconductor chip are stacked and coupled together.

24. The imaging system of claim 23 wherein the first semiconductor chip and the second semiconductor chip are coupled together with through silicon vias.

* * * * *